（12）United States Patent
Tsai et al.

(10) Patent No.: US 7,663,928 B2
(45) Date of Patent: Feb. 16, 2010

(54) SENSE AMPLIFIER CIRCUIT HAVING CURRENT MIRROR ARCHITECTURE

(75) Inventors: Hong-Ping Tsai, Hsinchu (TW);
Ching-Yuan Lin, Hsin-Chu Hsien (TW)

(73) Assignee: eMemory Technology Inc., Hsinchu (TW)

( * ) Notice: Subject to any disclaimer, the term of this patent is extended or adjusted under 35 U.S.C. 154(b) by 188 days.

(21) Appl. No.: 11/868,965

(22) Filed: Oct. 9, 2007

(65) Prior Publication Data
US 2009/0091995 A1  Apr. 9, 2009

(51) Int. Cl.
*G11C 11/34* (2006.01)
*G11C 16/06* (2006.01)
(52) U.S. Cl. ............ 365/185.21; 365/189.05; 365/205; 365/207; 365/210.1; 365/185.2; 327/57
(58) Field of Classification Search ............ 365/185.21, 365/205, 207–214, 189.05; 327/52–55, 57
See application file for complete search history.

(56) References Cited

U.S. PATENT DOCUMENTS

| | | | | |
|---|---|---|---|---|
| 5,612,613 | A * | 3/1997 | Dutt et al. .................. | 323/314 |
| 6,775,189 | B2 * | 8/2004 | Lin et al. ............... | 365/189.07 |
| 7,020,036 | B2 * | 3/2006 | Shen et al. ............... | 365/210.1 |
| 7,573,756 | B2 * | 8/2009 | Seo ........................ | 365/189.15 |
| 2007/0247885 | A1 * | 10/2007 | Watanabe et al. ............. | 365/49 |

* cited by examiner

*Primary Examiner*—Tuan T Nguyen
*Assistant Examiner*—R Lance Reidlinger
(74) *Attorney, Agent, or Firm*—Winston Hsu

(57) ABSTRACT

A sense amplifier circuit for use in a semiconductor memory device has complemented logic states at opposite sides of the latch circuit in the sense amplifier circuit determinate all the time in operation. The sense amplifier circuit takes advantage of a current mirror circuit for ascending or descending a voltage level at the gate of a transistor by charge accumulation or charge dissipation, which turns on or off the transistor so as to control the logic states at opposite sides of the latch circuit in the sense amplifier circuit.

18 Claims, 6 Drawing Sheets

SENSE AMPLIFIER CIRCUIT HAVING CURRENT MIRROR ARCHITECTURE

BACKGROUND OF THE INVENTION

1. Field of the Invention

The present invention relates in general to a sense amplifier circuit, and more particularly, to a sense amplifier circuit having current mirror architecture for semiconductor memory devices.

2. Description of the Prior Art

Since semiconductor memory devices (for example, flash memory, DRAM and SRAM, etc) have always been one of the most important components for electronic appliances, the performance of memory devices is highly demanded and is improving uninterruptedly.

Please refer to FIG. 1, which is a circuit diagram schematically showing the structure of a prior art sense amplifier circuit 100. The sense amplifier circuit 100 comprises a first current sensing unit 110, a second current sensing unit 130, and a latch circuit 150. The first current sensing unit 110 comprises NMOS transistors 111, 113 and 115, a PMOS transistor 117, and a first non-volatile memory unit 119. The second current sensing unit 130 comprises NMOS transistors 131, 133 and 135, a PMOS transistor 137, and a second non-volatile memory unit 139. The first non-volatile memory unit 119 comprises a PMOS transistor 123 and a first non-volatile memory device 121. The second non-volatile memory unit 139 comprises a PMOS transistor 143 and a second non-volatile memory device 141. The first and second non-volatile memory devices 121 and 141 are embedded memory cells, which can be floating-gate (FG) PMOS embedded memory cells.

The first and second current sensing units 110 and 130 are both coupled between a high bias supply Vdd and a low bias supply Vss. The latch circuit 150 comprises two inverters 151 and 153 coupled in series, with the output of one inverter electrically connected back to the input of the other inverter. The latch function of the pair of cross-coupled inverters 151 and 153 is a well-known prior art and, for the sake of brevity, further discussion is omitted.

The NMOS transistors 111 and 131 are turned on or off in response to a control signal RE. The NMOS transistors 113 and 133 together with the PMOS transistors 117 and 137 are turned on or off in response to a control signal ZRE. The PMOS transistors 123 and 143 are turned on or off in response to a control signal SG. The control signal ZRE is defined to be the complement of the control signal RE.

While performing a read operation, two consecutive steps, assumed to be a first step and a second step, corresponding to different control situations are required to complete the read operation. For explanation, the first non-volatile memory device 121 is assumed to be a programmed memory device and the second non-volatile memory device 141 is assumed to be an erased memory device. During the first step, the control signals RE and SG are activated and the control signal ZRE is deactivated. The term "activated" describes one signal state that assumes a high logic level, and the term "deactivated" describes the other signal state that assumes a low logic level. Accordingly, during the first step, the PMOS transistors 123 and 143 are turned off by the control signal SG, the NMOS transistors 111 and 131 are turned on by the control signal RE, the PMOS transistors 117 and 137 are turned on by the control signal ZRE and the NMOS transistors 113 and 133 are turned off by the control signal ZRE. Based on the situation in the first step, the voltage levels at nodes N1 and N2 are both pulled down to the low voltage level Vss, and the voltage levels at nodes N3 and N4 are both pulled up to the high voltage level Vdd.

During the second step, the control signals RE and SG are deactivated and the control signal ZRE is activated. Accordingly, during the second step, the PMOS transistors 123 and 143 are turned on by the control signal SG, the NMOS transistors 111 and 131 are turned off by the control signal RE, the PMOS transistors 117 and 137 are turned off by the control signal ZRE and the NMOS transistors 113 and 133 are turned on by the control signal ZRE. Based on the situation in the second step, a first current I1 is generated through the first non-volatile memory unit 119, and a second current I2 is generated through the second non-volatile memory unit 139. Therefore, the voltage level at node N1 is boosting owing to the charge accumulation resulting from the first current I1 forwarded to the node N1, and the voltage level at node N2 is boosting owing to the charge accumulation resulting from the second current I2 forwarded to the node N2.

When the first current I1 is higher than the second current I2, the charge-accumulating rate at node N1 is also higher than that at node N2, which means that the voltage level at node N1 is boosting faster than that at node N2. Accordingly, the voltage level at node N1 is able to achieve a threshold voltage for turning on the NMOS transistor 115 precedent to that for turning on the NMOS transistor 135, which results in pulling down the voltage level at node N3 to the low voltage level Vss and the inverter 151 in turn will output a high voltage level Vdd at node N4. On the contrary, when the second current I2 is higher than the first current I1, the voltage level at node N4 is pulled down to the low voltage level Vss and the inverter 153 will output a high voltage level Vdd at node N3.

The prior art sense amplifier circuit 100 is featured by that the latch circuit 150 is latched by turning on an NMOS transistor through accumulating charge for overcoming the threshold voltage. As a result, the current difference between the first current I1 and the second current I2 is not necessary to be significant and high noise-immunity can be achieved. However, during the first step, the voltage levels at nodes N3 and N4 are both pulled up to the high voltage level Vdd. Furthermore, during the second step, the voltage levels at nodes N3 and N4 are both floated before the latch circuit 150 is latched, which means that the voltage levels at nodes N3 and N4 are both indeterminate before finishing the latch operation. That is to say, if the voltage levels at N3 and N4 are required to be always complemented to each other and be determinate before finishing the latch operation, the aforementioned prior art sense amplifier circuit cannot meet the requirements.

SUMMARY OF THE INVENTION

The present invention therefore provides a sense amplifier circuit comprising a latch circuit, a first transistor, a second transistor, and a current mirror circuit. The latch circuit has a first terminal and a second terminal. The first transistor has a first terminal connected to the first terminal of the latch circuit, a second terminal connected to a low bias supply, and a gate. The second transistor has a first terminal connected to the second terminal of the latch circuit, a second terminal connected to the low bias supply, and a gate receiving a first control signal. The current mirror circuit has a first terminal receiving a first current, a second terminal connected to the gate of the first transistor, a third terminal connected to the low bias supply, and a fourth terminal connected to the low bias supply.

The present invention further provides a sense amplifier circuit comprising a latch circuit, a first transistor, a second transistor, and a current mirror circuit. The latch circuit has a first terminal and a second terminal. The first transistor has a first terminal connected to a high bias supply, a second terminal connected to the first terminal of the latch circuit, and a gate. The second transistor has a first terminal connected to the high bias supply, a second terminal connected to the second terminal of the latch circuit, and a gate receiving a first control signal. The current mirror circuit has a first terminal receiving a first current, a second terminal connected to the gate of the first transistor, a third terminal connected to the high bias supply, and a fourth terminal connected to the high bias supply.

These and other objectives of the present invention will no doubt become obvious to those of ordinary skill in the art after reading the following detailed description of the preferred embodiments, which are illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
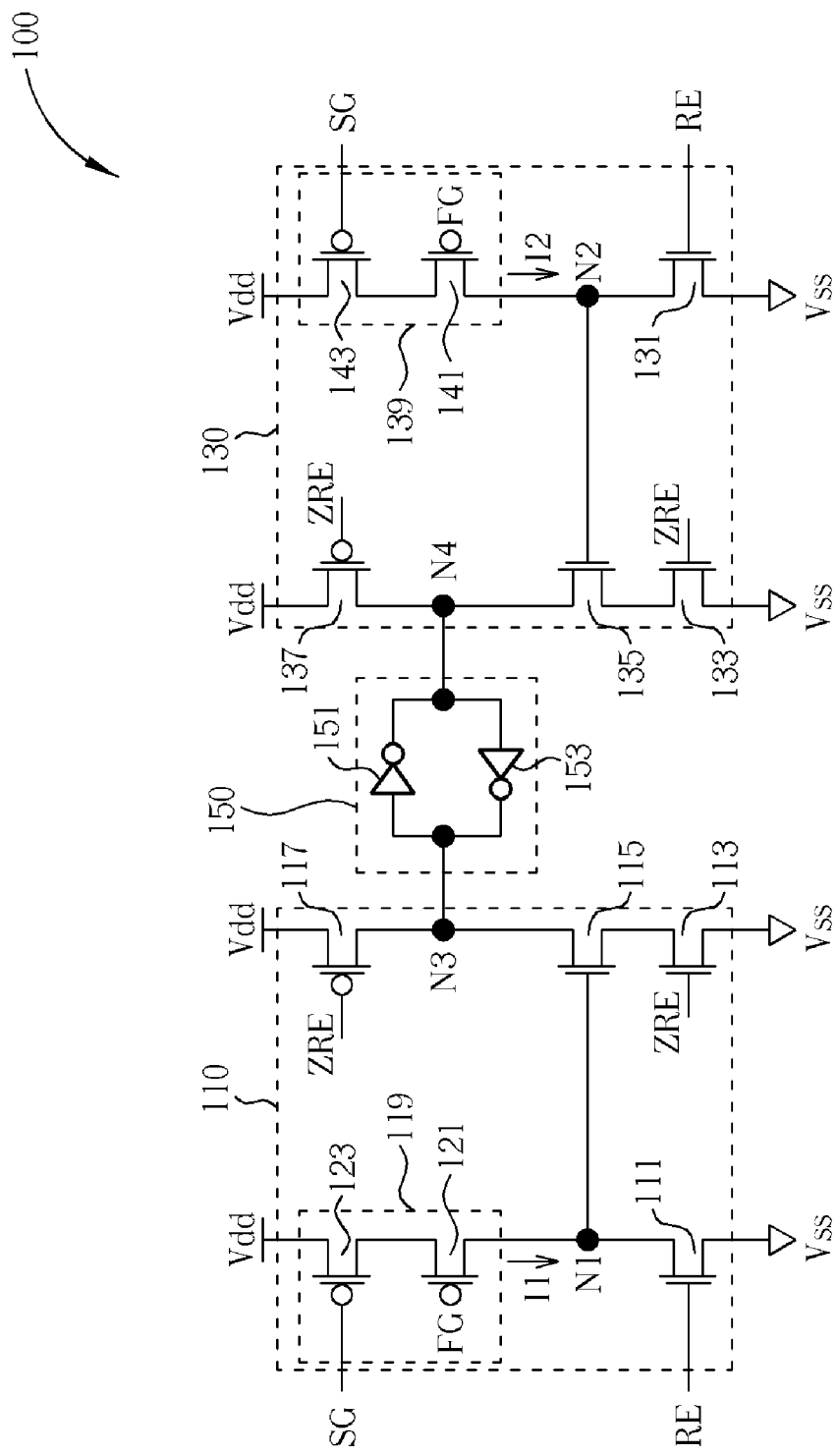
FIG. 1 is a circuit diagram schematically showing the structure of a prior art sense amplifier circuit.
Figure 2:
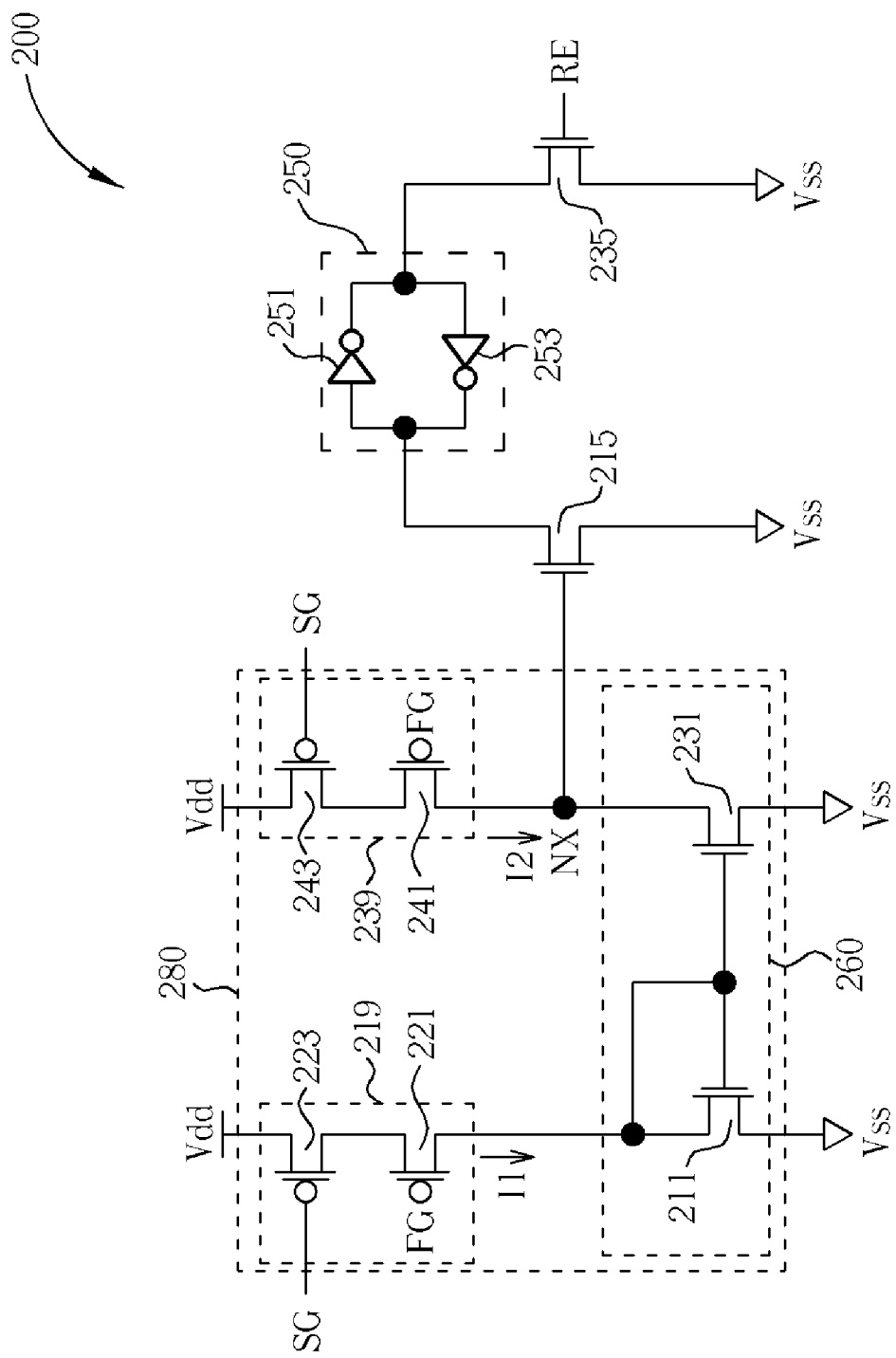
FIG. 2 is a circuit diagram schematically showing the structure of a sense amplifier circuit in accordance with a first preferred embodiment of the present invention.

Please refer to FIG. 2, which is a circuit diagram schematically showing the structure of a sense amplifier circuit 200 in accordance with a first preferred embodiment of the present invention. The sense amplifier circuit 200 comprises a current sensing unit 280, a latch circuit 250, and NMOS transistors 215 and 235. The current sensing unit 280 comprises a current mirror circuit 260, a first non-volatile memory unit 219, and a second non-volatile memory unit 239. The current mirror circuit 260 comprises two NMOS transistors 211 and 231. The first non-volatile memory unit 219 comprises a PMOS transistor 223 and a first non-volatile memory device 221. The second non-volatile memory unit 239 comprises a PMOS transistor 243 and a second non-volatile memory device 241. The first and second non-volatile memory devices 221 and 241 are embedded memory cells, which can be floating-gate (FG) PMOS embedded memory cells.

The current sensing unit 280 is coupled between a high bias supply Vdd and a low bias supply Vss. The latch circuit 250 comprises two inverters 251 and 253 coupled in series, with the output of one inverter electrically connected back to the input of the other inverter.

Figure 3:
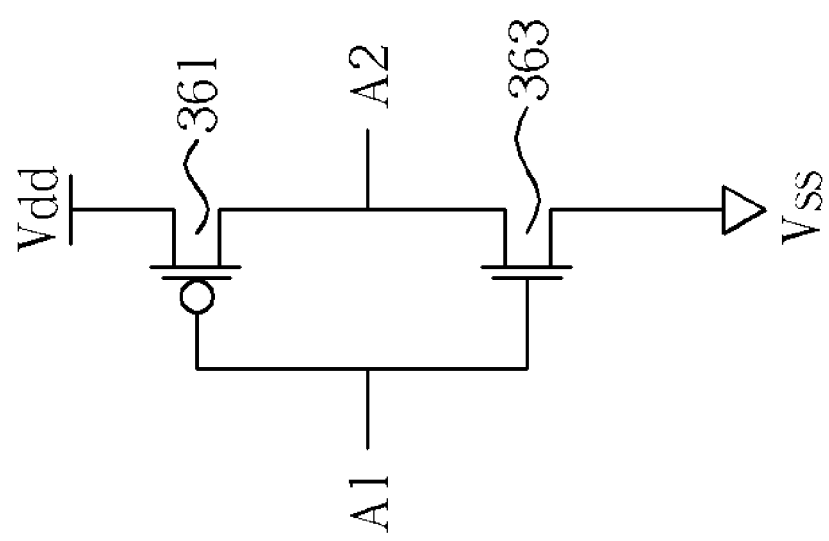
FIG. 3 is a circuit diagram schematically showing the structure of the inverters shown in FIG. 2.

Please refer to FIG. 3, which is a circuit diagram schematically showing the structure of the inverter 251 or 253 shown in FIG. 2. The inverter 251 or 253 may comprise a PMOS transistor 361 and an NMOS transistor 363. The gate of the PMOS transistor 361 and the gate of the NMOS transistor 363 are electrically connected at an input node A1. The first terminal of the PMOS transistor 361 and the first terminal of the NMOS transistor 363 are electrically connected at an output node A2. The second terminal of the PMOS transistor 361 is electrically connected to the high bias supply Vdd. The second terminal of the NMOS transistor 363 is electrically connected to the low bias supply Vss.

The PMOS transistors 223 and 243 are coupled to the high bias supply Vdd through the first terminals, and to the first terminals of the first and second non-volatile memory devices 221 and 241 respectively through the second terminals. A control signal SG is furnished to both the gates of the PMOS transistors 223 and 243. The NMOS transistors 211 and 231 are coupled to the second terminals of the first and second non-volatile memory devices 221 and 241 respectively through the first terminals, and to the low bias supply Vss through the second terminals. The gates of the NMOS transistors 211 and 231 are both electrically connected to the first terminal of the NMOS transistor 211. Please note that in the description hereinafter when the first terminal of a certain transistor functions as a source terminal, the second terminal of the certain transistor will function as a drain terminal. On the contrary, when the first terminal of a certain transistor functions as a drain terminal, the second terminal of the certain transistor will function as a source terminal.

The NMOS transistors 215 and 235 are coupled to the first and second terminals of the latch circuit 250 respectively through the first terminals, and to the low bias supply Vss through the second terminals. A control signal RE is furnished to the gate of the NMOS transistor 235. The gate of the NMOS transistor 215 is electrically connected to a node NX, which is also a connection node between the NMOS transistor 231 and the second non-volatile memory device 241. The first and second non-volatile units 219 and 239 generate a first current I1 and a second current I2 respectively according to the control signal SG in conjunction with the first and second non-volatile memory devices 221 and 241.

Similarly, two consecutive steps, still assumed to be a first step and a second step, are required to perform a read operation. During the first step, the control signals RE and SG are both activated, and then the NMOS transistor 235 is turned on and the PMOS transistors 223 and 243 are turned off. Based on the situation in the first step, the voltage level at the first terminal of the NMOS transistor 235, which is also the second terminal of the latch circuit 250, is pulled down to the low voltage level Vss. Thereafter, the inverter 253 outputs a high voltage level Vdd at the first terminal of the latch circuit 250 by inverting the low voltage level Vss at the second terminal of the latch circuit 250. That is to say, even though during the first step, the logic states at opposite sides of the latch circuit 250 are complemented to each other and are determinate.

During the second step, the control signals RE and SG are both deactivated, and then the NMOS transistor 235 is turned off and the PMOS transistors 223 and 243 are turned on. Based on the situation in the second step, a first current I1 is generated through the first non-volatile memory unit 219, and a second current I2 is generated through the second non-volatile memory unit 239.

When the first current I1 is lower than the second current I2, charge accumulation will occur to the node NX because of the functional operation of the current mirror circuit 260 and the voltage level at the node NX is then ascending. The term "charge accumulation" describes one state that assumes equivalent positive charge accumulation such as physically negative charge dissipation. Eventually, the voltage level at the node NX is able to achieve a threshold voltage for turning on the NMOS transistor 215, which means that the voltage level at the first terminal of the latch circuit 250 is switched from the high voltage level Vdd to the low voltage level Vss. Subsequently, the inverter 251 outputs a high voltage level Vdd at the second terminal of the latch circuit 250 by inverting the low voltage level Vss at the first terminal of the latch circuit 250.

On the contrary, when the first current I1 is higher than the second current I2, charge dissipation will occur to the node NX because of the functional operation of the current mirror circuit 260. The term "charge dissipation" describes one state that assumes equivalent positive charge dissipation such as physically negative charge accumulation. Consequently, the voltage level at the node NX is then descending, which means that the voltage level at the node NX is not able to achieve the threshold voltage for turning on the NMOS transistor 215. As a result, the logic states at opposite sides of the latch circuit 250 are unchanged and remain complemented to each other.

In summary, during the first and second steps for executing the read operation by the sense amplifier circuit 200, the logic states at opposite sides of the latch circuit 250 are complemented to each other and are determinate all the time.

Figure 4:
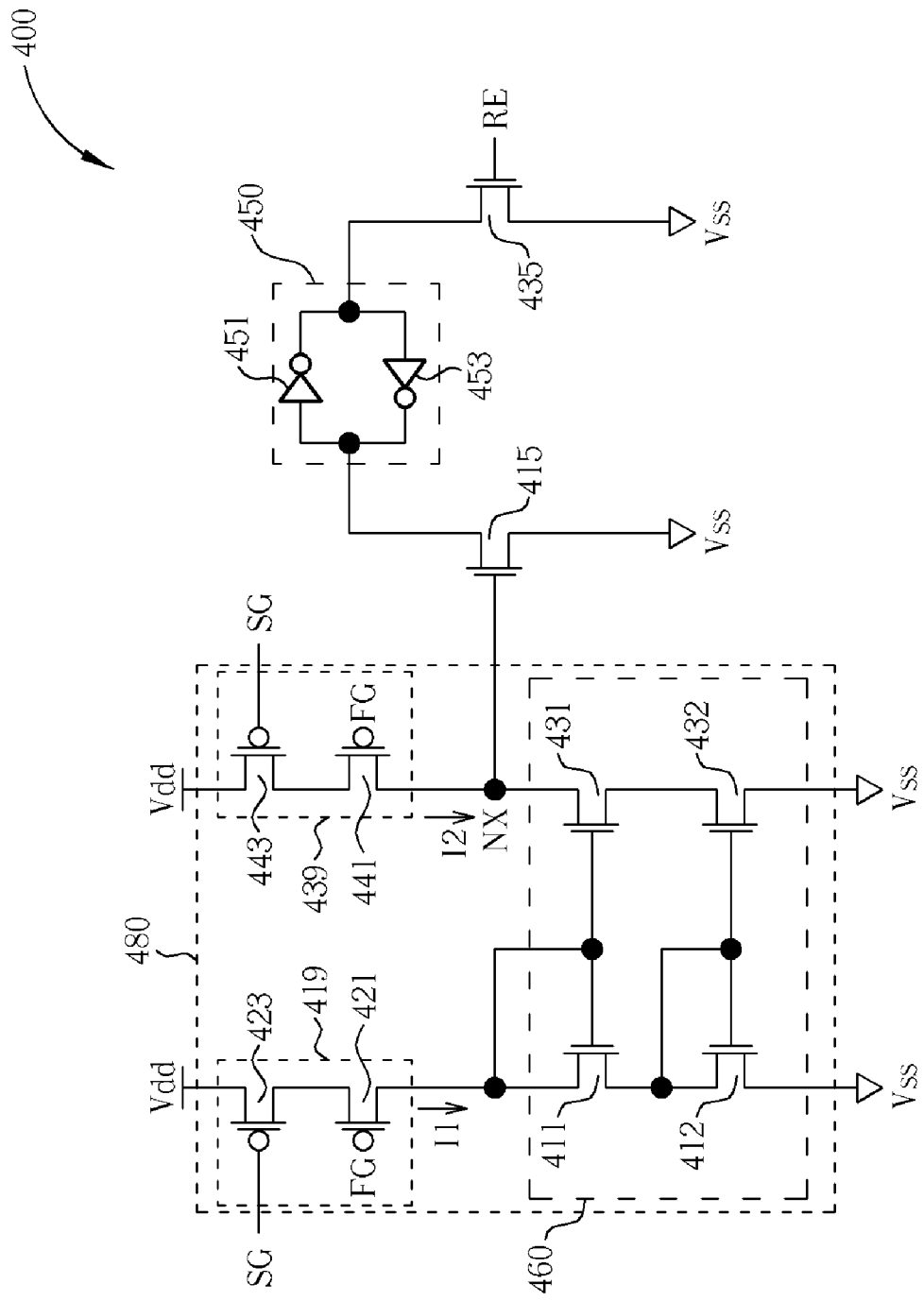
FIG. 4 is a circuit diagram schematically showing the structure of a sense amplifier circuit in accordance with a second preferred embodiment of the present invention.

Please refer to FIG. 4, which is a circuit diagram schematically showing the structure of a sense amplifier circuit 400 in accordance with a second preferred embodiment of the present invention. The sense amplifier circuit 400 comprises a current sensing unit 480, a latch circuit 450, and NMOS transistors 415 and 435. The current sensing unit 480 comprises a current mirror circuit 460, a first non-volatile memory unit 419, and a second non-volatile memory unit 439. The current mirror circuit 460 comprises four NMOS transistors 411, 431, 412 and 432. The first non-volatile memory unit 419 comprises a PMOS transistor 423 and a first non-volatile memory device 421. The second non-volatile memory unit 439 comprises a PMOS transistor 443 and a second non-volatile memory device 441. The first and second non-volatile memory devices 421 and 441 are embedded memory cells, which can be floating-gate (FG) PMOS embedded memory cells. The latch circuit 450 comprises two inverters 451 and 453 coupled in series, with the output of one inverter connected back to the input of the other inverter.

The NMOS transistors 411 and 431 are coupled to the second terminals of the first and second non-volatile memory devices 421 and 441 respectively through the first terminals, and to the first terminals of the NMOS transistors 412 and 432 respectively through the second terminals. The gates of the NMOS transistors 411 and 431 are both electrically connected to the first terminal of the NMOS transistor 411. The NMOS transistors 412 and 432 are coupled to the low bias supply Vss through the second terminals. The gates of the NMOS transistors 412 and 432 are both electrically connected to the first terminal of the NMOS transistor 412. The structure of the sense amplifier circuit 400 is similar to that of sense amplifier circuit 200 except for the current mirror circuit as shown in FIG. 2 and FIG. 4 and, for the sake of brevity, further detailed description on the architecture of the sense amplifier circuit 400 is omitted.

The functional operation of the sense amplifier circuit 400 is also similar to that of the sense amplifier circuit 200. During the first step of a read operation, the current mirror circuit 460 is not functional and the functional operation of the sense amplifier circuit 400 is exactly the same as that of the sense amplifier circuit 200. When the first current I1 is lower than the second current I2 during the second step of the read operation, charge accumulation will occur to the node NX because of the functional operation of the current mirror circuit 460 and the voltage level at the node NX is then ascending. Eventually, the voltage level at the node NX is able to achieve a threshold voltage for turning on the NMOS transistor 415, which means that the voltage level at the first terminal of the latch circuit 450 is switched from the high voltage level Vdd to the low voltage level Vss. Subsequently, the inverter 451 outputs a high voltage level Vdd at the second terminal of the latch circuit 450 by inverting the low voltage level Vss at the first terminal of the latch circuit 450.

On the contrary, when the first current I1 is higher than the second current I2, charge dissipation will occur to the node NX because of the functional operation of the current mirror circuit 460. Consequently, the voltage level at the node NX is then descending, which means that the voltage level at the node NX is not able to achieve the threshold voltage for turning on the NMOS transistor 415. As a result, the logic states at opposite sides of the latch circuit 450 are unchanged and remain complemented to each other.

In summary, during the first and second steps for executing the read operation by the sense amplifier circuit 400, the logic states at opposite sides of the latch circuit 450 are complemented to each other and are determinate all the time.

Figure 5:
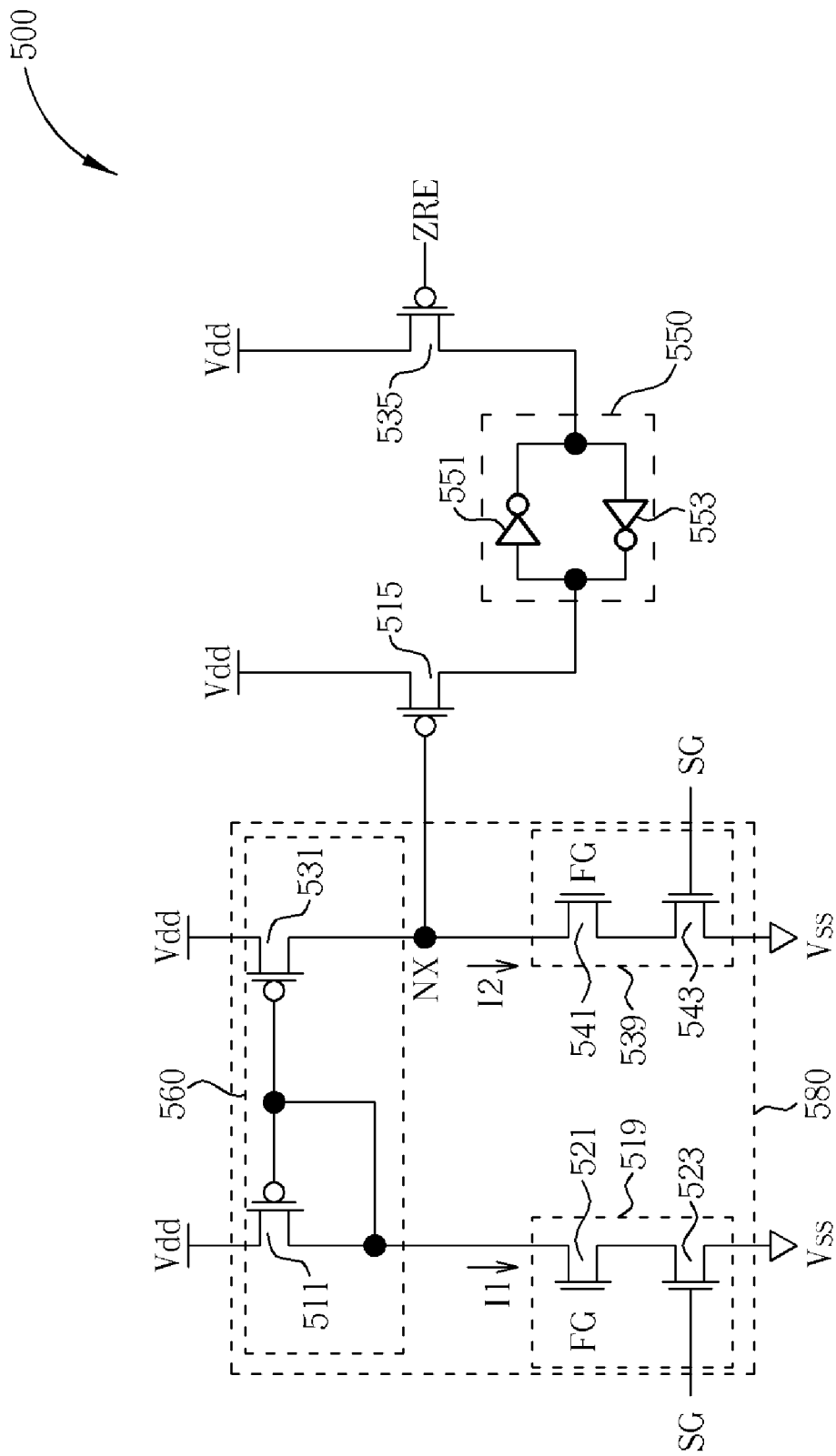
FIG. 5 is a circuit diagram schematically showing the structure of a sense amplifier circuit in accordance with a third preferred embodiment of the present invention.

Please refer to FIG. 5, which is a circuit diagram schematically showing the structure of a sense amplifier circuit 500 in accordance with a third preferred embodiment of the present invention. The sense amplifier circuit 500 comprises a current sensing unit 580, a latch circuit 550, and PMOS transistors 515 and 535. The current sensing unit 580 comprises a current mirror circuit 560, a first non-volatile memory unit 519, and a second non-volatile memory unit 539. The current mirror circuit 560 comprises two PMOS transistors 511 and 531. The first non-volatile memory unit 519 comprises an NMOS transistor 523 and a first non-volatile memory device 521. The second non-volatile memory unit 539 comprises an NMOS transistor 543 and a second non-volatile memory device 541. The first and second non-volatile memory devices 521 and 541 are embedded memory cells, which can be floating-gate (FG) NMOS embedded memory cells.

The current sensing unit 580 is coupled between a high bias supply Vdd and a low bias supply Vss. The latch circuit 550 comprises two inverters 551 and 553 coupled in series, with the output of one inverter connected back to the input of the other inverter. The structure of the inverter 551 or 553 can be the inverter structure shown in FIG. 3.

The NMOS transistors 523 and 543 are coupled to the low bias supply Vss through the second terminals, and to the second terminals of the first and second non-volatile memory devices 521 and 541 respectively through the first terminals. A control signal SG is furnished to both the gates of the NMOS transistors 523 and 543.

The PMOS transistors 511 and 531 are coupled to the first terminals of the first and second non-volatile memory devices 521 and 541 respectively through the second terminals, and to the high bias supply Vdd through the first terminals. The gates of the PMOS transistors 511 and 531 are both electrically connected to the second terminal of the PMOS transistor 511.

The PMOS transistors 515 and 535 are coupled to the first and second terminals of the latch circuit 550 respectively through the second terminals, and to the high bias supply Vdd through the first terminals. A control signal ZRE is furnished to the gate of the PMOS transistor 535. The gate of the PMOS transistor 515 is electrically connected to a node NX, which is also a connection node between the PMOS transistors 531 and the second non-volatile memory device 541. The first and second non-volatile units 519 and 539 generate a first current I1 and a second current I2 respectively according to the control signal SG in conjunction with the first and second non-volatile memory devices 521 and 541.

Similarly, two consecutive steps, still assumed to be a first step and a second step, are required to perform a read operation. During the first step, the control signals RE and SG are both deactivated, and then the PMOS transistor 535 is turned on and the NMOS transistors 523 and 543 are turned off. Based on the situation in the first step, the voltage level at the second terminal of the PMOS transistor 535, which is also the second terminal of the latch circuit 550, is pulled up to the high voltage level Vdd. Thereafter, the inverter 553 outputs a low voltage level Vss at the first terminal of the latch circuit 550 by inverting the high voltage level Vdd at the second terminal of the latch circuit 550. That is to say, even though during the first step, the logic states at opposite sides of the latch circuit 550 are complemented to each other and are determinate.

During the second step, the control signals RE and SG are both activated, and then the PMOS transistor 535 is turned off and the NMOS transistors 523 and 543 are turned on. Based on the situation in the second step, a first current I1 is generated through the first non-volatile memory unit 519, and a second current I2 is generated through the second non-volatile memory unit 539.

When the first current I1 is lower than the second current I2, charge dissipation will occur to the node NX because of the functional operation of the current mirror circuit 560 and the voltage level at the node NX is then descending. Eventually, the voltage level at the node NX is able to achieve a threshold voltage for turning on the PMOS transistor 515, which means that the voltage level at the first terminal of the latch circuit 550 is switched from the low voltage level Vss to the high voltage level Vdd. Subsequently, the inverter 551 outputs a low voltage level Vss at the second terminal of the latch circuit 550 by inverting the high voltage level Vdd at the first terminal of the latch circuit 550.

On the contrary, when the first current I1 is higher than the second current I2, charge accumulation will occur to the node NX because of the functional operation of the current mirror circuit 560. Consequently, the voltage level at the node NX is then ascending, which means that the voltage level at the node NX is not able to achieve the threshold voltage for turning on the PMOS transistor 515. As a result, the logic states at opposite sides of the latch circuit 550 are unchanged and remain complemented to each other.

In summary, during the first and second steps for executing the read operation by the sense amplifier circuit 500, the logic states at opposite sides of the latch circuit 550 are complemented to each other and are determinate all the time.

Figure 6:
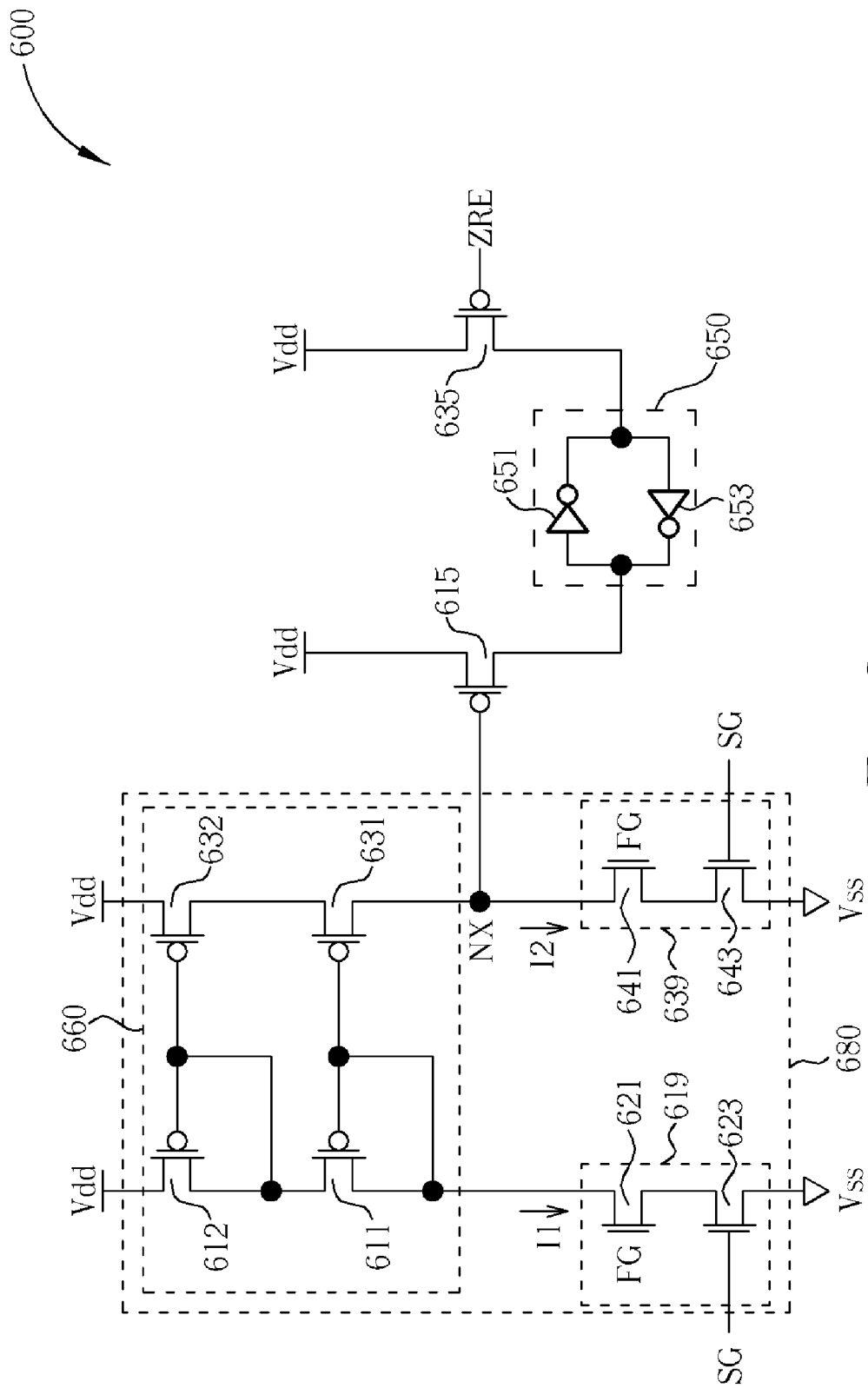
FIG. 6 is a circuit diagram schematically showing the structure of a sense amplifier circuit in accordance with a fourth preferred embodiment of the present invention.

Please refer to FIG. 6, which is a circuit diagram schematically showing the structure of a sense amplifier circuit 600 in accordance with a fourth preferred embodiment of the present invention. The sense amplifier circuit 600 comprises a current sensing unit 680, a latch circuit 650, and PMOS transistors 615 and 635. The current sensing unit 680 comprises a current mirror circuit 660, a first non-volatile memory unit 619, and a second non-volatile memory unit 639. The current mirror circuit 660 comprises four PMOS transistors 611, 631, 612 and 632. The first non-volatile memory unit 619 comprises an NMOS transistor 623 and a first non-volatile memory device 621. The second non-volatile memory unit 639 comprises an NMOS transistor 643 and a second non-volatile memory device 641. The first and second non-volatile memory devices 621 and 641 are embedded memory cells, which can be floating-gate (FG) PMOS embedded memory cells. The latch circuit 650 comprises two inverters 651 and 653 coupled in series, with the output of one inverter connected back to the input of the other inverter.

The PMOS transistors 611 and 631 are coupled to the first terminals of the first and second non-volatile memory devices 621 and 641 respectively through the second terminals, and to the second terminals of the PMOS transistors 612 and 632 respectively through the first terminals. The gates of the PMOS transistors 611 and 631 are both electrically connected to the second terminal of the PMOS transistor 611. The PMOS transistors 612 and 632 are coupled to the high bias supply Vdd through the first terminals. The gates of the PMOS transistors 612 and 632 are both electrically connected to the second terminal of the PMOS transistor 612. The structure of the sense amplifier circuit 600 is similar to that of sense amplifier circuit 500 except for the current mirror circuit as shown in FIG. 5 and FIG. 6 and, for the sake of brevity, further detailed description on the architecture of the sense amplifier circuit 600 is omitted.

The functional operation of the sense amplifier circuit 600 is also similar to that of the sense amplifier circuit 500. During the first step of a read operation, the current mirror circuit 660 is not functional and the functional operation of the sense amplifier circuit 600 is exactly the same as that of the sense amplifier circuit 500. When the first current I1 is lower than the second current I2 during the second step of the read operation, charge dissipation will occur to the node NX because of the functional operation of the current mirror circuit 660 and the voltage level at the node NX is then descending. Eventually, the voltage level at the node NX is able to achieve a threshold voltage for turning on the PMOS transistor 615, which means that the voltage level at the first terminal of the latch circuit 650 is switched from the low voltage level Vss to the high voltage level Vdd. Subsequently, the inverter 651 outputs a low voltage level Vss at the second terminal of the latch circuit 650 by inverting the high voltage level Vdd at the first terminal of the latch circuit 650.

On the contrary, when the first current I1 is higher than the second current I2, charge accumulation will occur to the node NX because of the functional operation of the current mirror circuit 660. Consequently, the voltage level at the node NX is then ascending, which means that the voltage level at the node NX is not able to achieve the threshold voltage for turning on the PMOS transistor 615. As a result, the logic states at opposite sides of the latch circuit 650 are unchanged and remain complemented to each other.

In summary, during the first and second steps for executing the read operation by the sense amplifier circuit 600, the logic states at opposite sides of the latch circuit 650 are complemented to each other and are determinate all the time.

To sum up, the sense amplifier circuit according to the present invention is able to provide complemented logic states at opposite sides of the latch circuit in the sense amplifier circuit determinate all the time regardless of the read operation.

Those skilled in the art will readily observe that numerous modifications and alterations of the device and method may be made while retaining the teachings of the invention.

What is claimed is:

1. A sense amplifier circuit for a semiconductor memory device, comprising:
   a latch circuit having a first terminal and a second terminal;
   a first transistor having a first terminal electrically connected to the first terminal of the latch circuit, a second terminal electrically connected to a low bias supply, and a gate;

a second transistor having a first terminal electrically connected to the second terminal of the latch circuit, a second terminal electrically connected to the low bias supply, and a gate for receiving a first control signal; and a current mirror circuit having a first terminal for receiving a first current, a second terminal electrically connected to the gate of the first transistor, a third terminal electrically connected to the low bias supply, and a fourth terminal electrically connected to the low bias supply wherein the latch circuit comprises:

a first inverter having an input terminal electrically connected to he first terminal of the first transistor, and an output terminal electrically connected to the first terminal of the second transistor; and a second inverter having an input terminal electrically connected to the first terminal of the second transistor, and an output terminal electrically connected to the first terminal of the first transistor.

2. The sense amplifier circuit of claim 1, wherein the first and second transistors are NMOS transistors.

3. The sense amplifier circuit of claim 1, wherein the current mirror circuit comprises:

a third transistor having a first terminal for receiving the first current, a gate electrically connected to the first terminal, and a second terminal electrically connected to the low bias supply; and a fourth transistor having a gate electrically connected to the gate of the third transistor, a first terminal electrically connected to the gate of the first transistor, and a second terminal electrically connected to the low bias supply.

4. The sense amplifier circuit of claim 3, wherein the third and fourth transistors are NMOS transistors.

5. The sense amplifier circuit of claim 1, wherein the current mirror circuit comprises:

a third transistor having a first terminal for receiving the first current, a gate electrically connected to the first terminal, and a second terminal;

a fourth transistor having a gate electrically connected to the gate of the third transistor, a first terminal electrically connected to the gate of the first transistor, and a second terminal;

a fifth transistor having a first terminal electrically connected to the second terminal of the third transistor, a gate electrically connected to the first terminal, and a second terminal electrically connected to the low bias supply; and a sixth transistor having a first terminal electrically connected to the second terminal of the fourth transistor, a gate electrically connected to the gate of the fifth transistor, and a second terminal electrically connected to the low bias supply.

6. The sense amplifier circuit of claim 5, wherein the third through sixth transistors are NMOS transistors.

7. The sense amplifier circuit of claim 1, further comprising:

a first non-volatile memory unit having a first terminal electrically connected to a high bias supply, and a second terminal electrically connected to the first terminal of the current mirror circuit for outputting the first current; and a second non-volatile memory unit having a first terminal electrically connected to the high bias supply, and a second terminal electrically connected to the second terminal of the current mirror circuit for outputting a second current.

8. The sense amplifier circuit of claim 7, wherein each of the first and the second non-volatile memory units comprises:

a third transistor having a gate receiving a second control signal, a first terminal electrically connected to the high bias supply, and a second terminal; and a non-volatile memory device having a first terminal electrically connected to the second terminal of the third transistor, wherein a second terminal of the non-volatile memory device of the first non-volatile memory unit is electrically connected to the first terminal of the current mirror circuit and a second terminal of the non-volatile memory device of the second non-volatile memory unit is electrically connected to the second terminal of the current mirror circuit.

9. The sense amplifier circuit of claim 8, wherein the third transistor is a PMOS transistor and the non-volatile memory device is a floating-gate (FG) PMOS embedded memory cell.

10. A sense amplifier circuit for a semiconductor memory device, comprising:

a latch circuit having a first terminal and a second terminal;

a first transistor having a first terminal electrically connected to a high bias supply, a second terminal electrically connected to the first terminal of the latch circuit, and a gate;

a second transistor having a first terminal electrically connected to the high bias supply, a second terminal electrically connected to the second terminal of the latch circuit, and a gate for receiving a first control signal; and a current mirror circuit having a first terminal for receiving a first current, a second terminal electrically connected to the gate of the first transistor, a third terminal electrically connected to the high bias supply, and a fourth terminal electrically connected to the high bias supply wherein the latch circuit comprises:

a first inverter having an input terminal electrically connected to the second terminal of the first transistor, and an output terminal electrically connected to the second terminal of the second transistor; and a second inverter having an input terminal electrically connected to the second terminal of the second transistor, and an output terminal electrically connected to the second terminal of the first transistor.

11. The sense amplifier circuit of claim 10, wherein the first and second transistors are PMOS transistors.

12. The sense amplifier circuit of claim 11, wherein the current mirror circuit comprises:

a third transistor having a first terminal electrically connected to the high bias supply, a second terminal for receiving the first current, and a gate electrically connected to the second terminal; and a fourth transistor having a gate electrically connected to the gate of the third transistor, a first terminal electrically connected to the high bias supply, and a second terminal electrically connected to the gate of the first transistor.

13. The sense amplifier circuit of claim 12, wherein the third and fourth transistors are PMOS transistors.

14. The sense amplifier circuit of claim 10, wherein the current mirror circuit comprises:

a third transistor having a first terminal, a second terminal for receiving the first current, and a gate electrically connected to the second terminal;

a fourth transistor having a gate electrically connected to the gate of the third transistor, a first terminal, and a second terminal electrically connected to the gate of the first transistor;

a fifth transistor having a first terminal electrically connected to the high bias supply, a second terminal electrically connected to the first terminal of the third transistor, and a gate electrically connected to the second terminal; and a sixth transistor having a first terminal electrically connected to the high bias supply, a gate electrically connected to the gate of the fifth transistor, and a second terminal electrically connected to the first terminal of the fourth transistor.

15. The sense amplifier circuit of claim 14, wherein the third through sixth transistors are PMOS transistors.

16. The sense amplifier circuit of claim 10, further comprising:

a first non-volatile memory unit having a first terminal electrically connected to the first terminal of the current mirror circuit for outputting the first current, and a second terminal electrically connected to a low bias supply; and a second non-volatile memory unit having a first terminal electrically connected to the second terminal of the current mirror circuit for outputting a second current, and a second terminal electrically connected to the low bias supply.

17. The sense amplifier circuit of claim 16, wherein each of the first and the second non-volatile memory units comprises:

a third transistor having a gate for receiving a second control signal, a first terminal, and a second terminal electrically connected to the low bias supply; and a non-volatile memory device having a first terminal electrically connected to first terminal of the third transistor, wherein a second terminal of the non-volatile memory device of the first non-volatile memory unit is electrically connected to the first terminal of the current mirror circuit and a second terminal of the non-volatile memory device of the second non-volatile memory unit is electrically connected to the second terminal of the current mirror circuit.

18. The sense amplifier circuit of claim 17, wherein the third transistor is an NMOS transistor and the non-volatile memory device is a floating-gate (FG) NMOS embedded memory cell.

* * * * *